United States Patent [19]

Noguchi et al.

[11] Patent Number: 5,543,266
[45] Date of Patent: Aug. 6, 1996

[54] ACTIVE ENERGY RAY-CURING RESIN COMPOSITION

[75] Inventors: Hiromichi Noguchi, Atsugi; Tadayoshi Inamoto, Machida; Megumi Munakata, Atsugi, all of Japan

[73] Assignee: Canon Kabushiki Kaisha, Tokyo, Japan

[21] Appl. No.: 415,168

[22] Filed: Mar. 13, 1995

Related U.S. Application Data

[63] Continuation of Ser. No. 219,870, Mar. 29, 1994, abandoned, which is a continuation of Ser. No. 924,570, Aug. 5, 1992, abandoned, which is a continuation of Ser. No. 537,145, Jun. 12, 1990, abandoned, which is a continuation of Ser. No. 246,932, Sep. 19, 1988, abandoned, which is a continuation of Ser. No. 876,080, Jun. 19, 1986, abandoned.

[30] Foreign Application Priority Data

Jun. 26, 1985 [JP] Japan ................................ 60-138036
Jul. 2, 1985 [JP] Japan ................................ 60-144000

[51] Int. Cl.$^6$ ............................................ G03C 1/725
[52] U.S. Cl. ............................ 430/280.1; 522/15; 522/31; 522/102; 525/92; 525/94; 525/118
[58] Field of Search ........................... 430/280, 280.1; 522/1.5, 31, 1.02; 525/92, 94, 118

[56] References Cited

U.S. PATENT DOCUMENTS

| | | | |
|---|---|---|---|
| 3,382,297 | 5/1968 | Thompson | 525/94 |
| 3,450,613 | 6/1969 | Steinberg | 522/103 |
| 3,607,977 | 9/1971 | Taylor | 525/94 |
| 3,655,826 | 4/1972 | Fellman et al. . | |
| 3,711,575 | 1/1973 | Kakefuda et al. . | |
| 3,746,673 | 7/1973 | Simms | 525/63 |
| 3,764,324 | 10/1973 | Reyes | 522/102 |
| 3,793,398 | 2/1974 | Hokamura | 525/49 |
| 4,148,967 | 4/1979 | Satoh | 522/102 |
| 4,163,809 | 8/1979 | McGinniss | 522/102 |
| 4,181,581 | 1/1980 | Iwata | 525/94 |
| 4,299,938 | 11/1981 | Green | 522/31 |
| 4,366,289 | 12/1982 | Keskkula | 525/94 |
| 4,394,670 | 7/1983 | Sugitani et al. . | |
| 4,412,224 | 10/1983 | Sugitani . | |
| 4,417,251 | 11/1983 | Sugitani . | |
| 4,429,076 | 1/1984 | Saito | 525/94 |
| 4,437,100 | 3/1984 | Sugitani et al. . | |
| 4,509,063 | 4/1985 | Sugitani et al. . | |
| 4,521,787 | 6/1985 | Yokota et al. . | |
| 4,524,183 | 6/1985 | Weber | 525/118 |
| 4,533,975 | 8/1985 | Bill . | |
| 4,554,322 | 11/1985 | Kwiecinski . | |
| 4,593,067 | 6/1986 | Nakayama | 525/92 |
| 4,688,052 | 8/1987 | Inamoto et al. . | |
| 4,688,053 | 8/1987 | Noguchi et al. . | |
| 4,688,054 | 8/1987 | Inamoto et al. . | |
| 4,688,055 | 8/1987 | Noguchi et al. . | |
| 4,688,056 | 8/1987 | Noguchi et al. . | |

FOREIGN PATENT DOCUMENTS

| | | |
|---|---|---|
| 2411753 | 10/1975 | Germany . |
| 2610437 | 9/1976 | Germany . |
| 47-47865 | 2/1972 | Japan . |
| 57-87409 | 5/1982 | Japan . |

*Primary Examiner*—Mark Chapman
*Attorney, Agent, or Firm*—Fitzpatrick, Cella, Harper & Scinto

[57] ABSTRACT

An active energy ray-curing resin composition comprises (i) a graft copolymerized polymer, (iii) an epoxy resin comprising at least one compound having one or more epoxy groups in the molecule and (iv) a polymerization initiator capable of generating a Lewis acid by irradiation of an active energy ray.

5 Claims, No Drawings

ACTIVE ENERGY RAY-CURING RESIN COMPOSITION

This application is a continuation of application Ser. No. 08/219,870, filed Mar. 29, 1994, now abandoned, which is a continuation of application Ser. No. 07/924,570, filed Aug. 5, 1992, now abandoned, which is a continuation of application Ser. No. 07/537,145, filed Jun. 12, 1990, now abandoned, which is a continuation of application Ser. No. 07/246,932, filed Sep. 19, 1988, now abandoned, which is a continuation of application Ser. No. 06/876,080, filed Jun. 19, 1986, now abandoned.

BACKGROUND OF THE INVENTION

1. Field of the Invention

This invention relates to a resin composition which can be cured by irradiation of an active energy ray, such as UV-ray, electron beam, etc., particularly to an active energy ray curing type resin composition which is excellent in adhesion to substrates such as glass, ceramics, plastic films, etc., chemical resistance and mechanical strength, also has high sensitivity and high resolution as the pattern forming material, and is suitable for formation of a pattern comprising a cured film of high density. The active energy ray-curing resin composition is a resin composition which can be formed into a solid photosensitive sheet (dry film).

2. Related Background Art

In recent years, active energy ray curing resins have been frequently used as coating materials, inks, sealing materials, resist materials, and pattern forming materials. Active energy ray-curing resins as the pattern forming materials have been used for preparation of printing plates at the initial stage, but they have been recently utilized also for construction materials for precise instruments such as inkjet recording heads as disclosed in Japanese Laid-open Patent Application No. 57-43876, in addition to having been utilized electronic industries such as printed wiring, integraded circuits, etc.

However, among the active energy ray-curing resins used for pattern formation heretofore known, particularly among those of dry film type, there has been no resin excellent in adhesion to a substrates such as glass, ceramics or plastic films, etc. On the other hand, those which are known as photocurable type coating materials or adhesives to be used for glass, metals, ceramics, etc. are excellent in adhesion, but irradiation of a strong active energy ray or prolonged irradiation is required, and yet they generally do not have suitable properties for pattern formation. Thus, even if it was attempted to obtain a pattern by irradiating an active energy ray in a pattern by use of these materials and removing the non-exposed portion by development, it was impossible to obtain a pattern of high precision and high resolution.

As described above, in the prior art, there has been no material which is capable of forming a precise pattern with excellent adhesion on various substrates, and which pattern has also high durability as the construction material.

SUMMARY OF THE INVENTION

An object of the present invention is to provide an active energy ray-curing resin composition which could not be accomplished by the active energy ray-curing resin of the prior art as described above, which is excellent in adhesion to a substrate not only when used as a liquid coating on a substrate but also when used to be in the form of dry film adhered onto a substrate, has also high sensitivity to an active energy ray and can form a precise and high resolution pattern.

Another object of the present invention is to provide an active energy ray-curing resin composition, which can be formed into a dry film convenient for formation of a pattern, and can also give a pattern formed by curing with irradiation of an active energy ray and optional heating treatment, which is excellent in chemical resistance and mechanical strength, and also has high durability as the construction material.

According to the present invention, there is provided an active energy ray-curing resin composition comprising the component (i) shown below, at least one of the components (ii) and (iii) shown below and the component (iv) shown below as the essential components:

(i) a graft copolymerized polymer comprising a trunk chain composed mainly of structural units derived from at least one monomer selected from the group consisting of alkyl methacrylates, acrylonitrile and styrene, having graft chains composed mainly of structural units derived from at least one monomer selected from the group consisting of (A) hydroxyl containing acrylic monomers, (B) amino or alkylamino containing acrylic monomers, (C) carboxyl containing acrylic or vinyl monomers, (D) N-vinylpyrrolidone or its derivatives, (E) vinylpyridine or its derivatives and (F) acrylamide derivatives represented by the following general formula I:

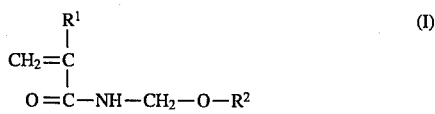

(wherein $R^1$ is hydrogen or alkyl or hydroxyalkyl group having 1 to 3 carbon atoms, and $R^2$ is hydrogen or alkyl or acyl group having 1 to 4 carbon atoms which may have hydroxy group.),
added to said trunk chain;

(ii) a monomer having an ethylenically unsaturated bond;

(iii) an epoxy resin comprising at least one compound having one or more epoxy groups in the molecule;

(iv) a polymerization initiator capable of generating a Lewis acid by irradiation of an active energy ray.

DESCRIPTION OF THE PREFERRED EMBODIMENTS

The graft copolymerized polymer (i) which is the essential component of the active energy ray-curing resin composition of the present invention comprises a trunk chain having relatively rigid properties suitable for a structural material having graft chains composed mainly of the above monomers (A)–(F) having hydrophilic property and exhibiting excellent adhesion to the substrate added thereto.

In constituting the above graft copolymerized polymer, specific examples of the monomers (A)–(F) to be used for constitution of the graft chains are shown below. Examples of the acrylic monomer containing hydroxyl group (s) of (A) include 2-hydroxyethyl(meth)acrylate [hereinafter, (meth)acrylate means to include both acrylate and methacrylate], 2-hydroxypropyl(meth)acrylate, 3-chloro-2-hydroxypropyl(meth)acrylate, 4-hydroxybutyl(meth)acrylate, 3-hydroxybutyl(meth)acrylate, 5-hydroxypentyl(meth)acrylate, 6-hydroxyhexyl(meth)acrylate, or monoester of 1,4-cyclohexanedimethanol with acrylic acid or methacrylic acid, including those obtained under the trade names of Aronix M5700 (produced by Toa Gosei Kagaku K.K.), TONE M100 (caprolactone acrylate, produced by Union Carbide), Light Ester HO-mpp (produced by Kyoeisha Yushi Kagaku Kogyo K.K.), Light Ester M-600A (trade name of 2-hydroxy-3-phenoxypropylacrylate, produced by Kyoeisha Yushi Kagaku Kogyo K.K. ), and also monoesters of divalent alcohols such as 1,10-decanediol, neopentylglycol, bis(2-hydroxyethyl)terephthalate, bisphenol A and addition products of ethylene oxide or propylene oxide with (meth) acrylylic acid.

Examples of the amino or alkylamino containing acrylic monomer of (B) include (meth)acrylamide, N,N-dimethylaminoethyl(meth)acrylamide, N,N-dimethyl(meth)acrylamide, N,N-dimethylaminopropyl(meth)acrylamide, N,N-di-t-butylaminoethyl(meth)acrylamide and the like.

Examples of the carboxyl containing acrylic or vinyl monomer of (C) include (meth)acrylic acid, fumaric acid, itaconic acid or those known under the trade names of Aronix M-5400, Aronix M-5500, etc.

Examples of vinylpyridine or its derivatives of (E) include 2-vinylpyridine, 4-vinylpyridine, 2-vinyl-6-methylpyridine, 4-vinyl-1-methylpyridine, 2-vinyl-5-ethylpyridine, 4-(4-pipenilinoethyl)pyridine and the like.

The above monomers (A)–(E) all have hydrophilic properties and impart firm adhesion when the composition of the present invention is adhered to substrates such as glass, ceramics, plastic, etc.

Examples of the acrylamide derivative represented by the formula I of (F) include monomers having hydrophilic property and also heat cross-linkability such as N-methylol(meth)acrylamide, N-propoxymethyl(meth)acrylamide, N-n-butoxymethyl(meth)acrylamide, β-hydroxyethoxymethyl(meth)acrylamide, N-ethoxymethyl(meth)acrylamide, (meth) acrylamide, N-methoxymethyl(meth)acrylamide, α-hydroxymethyl-N-methylolacrylamide, α-hydroxyethyl-N-butoxymethylacrylamide, α-hydroxypropyl-N-propoxymethylacrylamide, α-ethyl-N-methylolacrylamide, α-propyl-N-methylolacrylamide and the like. These monomers (F) have hydrophilic property as a matter of course, and also condensing crosslinkability by heating, and will generally form crosslinked bonds by elimination of water molecules or alcohol at a temperature of 100° C. or higher, thereby to form a network structure also in the graft copolymerized polymer itself after curing, whereby the pattern obtained by curing can be further improved in chemical resistance and mechanical strength, etc., to make the present invention more effective.

Also, to the above monomers (A)–(F), monomer which can be crosslinked by ring opening by heat such as glycidyl-(meth)acrylate may be partially added to constitute the graft chains, whereby the same effect as in the above (F) can be obtained.

In addition to the above thermal crosslinking, for the same purpose, it is also effective to crosslink the graft copolymerized polymer with an active energy ray by introducing a photopolymerizable side chain into a part of the graft chains of the graft copolymer in the present invention. As the method for imparting photopolymerizability to the graft chain, there may be employed for example, ⓘ the method in which a carboxyl containing monomer exemplified by (meth)acrylic acid, etc., or an amino or tertiary amine containing monomer is copolymerized, followed by the reaction with glycidyl(meth)acrylate, etc.;

ⓙ the method in which a partial urethane compound of polyisocyanate having one isocyanate group and one or more acrylic ester groups in one molecule is reacted with the hydroxyl group, amino group or carboxyl group in the graft chain;

ⓚ the method in which acrylic acid chloride is reacted with the hydroxyl groups in the graft chain;

ⓛ the method in which an acid anhydride is reacted with the hydroxyl group in the graft chain, followed by the reaction with glycidyl (meth)acrylate;

ⓜ the method in which the hydroxyl group in the graft chain is condensed with the condensing crosslinkable monomer as exemplified in (F), thereby leaving acrylamide group in the side chain;

ⓝ the method in which the hydroxyl group in the graft chain is reacted with glycidyl(meth)acrylate; etc.

When the graft chain of the graft copolymerized polymer in the present invention is heat crosslinkable, it is preferable to perform heating after formation of a pattern by irradiation of an active energy ray. On the other hand, also when the above graft chain is photopolymerizable, there is no problem in performing heating within the range permissible with respect to heat resistance of the substrate, and rather preferable results can be obtained by heating.

The graft chains are not limited to those derived only from the hydrophilic monomers as exemplified by the above (A)–(F), but the graft chains may also contain various hydrophobic monomers which can exhibit various other functions as the copolymer component within the range of 0 to about 25 weight %.

The monomer constituting the trunk chain of the graft copolymerized polymer in the present invention is an alkyl methacrylate having 1 to 4 carbon atoms in the alkyl group such as methyl methacrylate, ethyl methacrylate, isobutyl methacrylate, t-butyl methacrylate, etc., acrylonitrile and styrene.

The trunk chain is not limited to those derived from only the above monomers, but it may be also a trunk chain using other monomers such as methyl acrylate, ethyl acrylate, n-butyl acrylate, lauryl acrylate, n-butyl methacrylate, 2-ethylhexyl methacrylate, glycidyl methacrylate, vinyl acetate, etc., as the copolymer component within the range of 0 to about 50 weight %.

In the composition of the present invention, the above trunk chain gives high cohesive strength to the composition. The composition of the present invention can be provided in various shapes depending on the purpose of use, such as solutions or solid films, etc. However, when it is used as a dry film, it is preferable to use a relatively rigid trunk chain having a glass transition temperature of about 50° C. or higher in order to maintain the composition in the shape of a film. In this application, the trunk chain to be used may be constituted of two or more kinds having different glass transition temperatures. On the other hand, when the composition of the present invention is to be used as a solution, it is possible to use a trunk chain having a low glass transition temperature so as to give the composition flexibility. However, also in this case, in order to obtain a pattern having excellent chemical resistance and high mechanical strength, it is preferable to use a trunk chain having a high glass transition temperature.

The graft copolymerized polymers to be used in the present invention may be classified broadly into those having no curability, those having photo-crosslinkability and those having heat crosslinkability. In either case, the graft copolymerized polymer enables precise patterning by imparting form maintaining property to the composition in the curing steps (namely active energy ray irradiation and optional heat curing) of the composition of the present invention, and also gives excellent adhesiveness, and chemical resistance as well as high mechanical strength to the pattern obtained by curing.

The above graft copolymerized polymer to be used in the composition of the present invention can be prepared according to known methods, specifically by various methods as disclosed in "Base and Application of Polymer Alloy" p. 10–35 (edited by Polymer Society of Japan, published by Tokyo Kagaku Dojin K.K., 1981). Examples of those methods include ① the chain transfer method, ② the method by use of radiation, ③ the oxidation polymerization method, ④ the ion graft polymerization method and ⑤ macromonomer method. For the graft copolymer to be used in the present invention, since the surface active effect is marked when the length of the graft chains are uniform, it is preferable to use the method of ④ and ⑤, particularly preferably the macromonomer method of ⑤ which is advantageous in design of materials. The graft copolymer should preferably have a weight-average molecular weight of about 5000 to 300000 and, when used as a dry film, preferably about 30000 to 300000.

The monomer (ii) having an ethylenically unsaturated bond to be used in the composition of the present invention is a component for permitting the composition of the present invention to exhibit curability with an active energy ray, particularly imparting excellent sensitivity to an active energy ray to the composition of the present invention, similarly as the epoxy resin (iii) as hereinafter described. The monomer (ii) having an ethylenically unsaturated bond should preferably have a boiling point of 100° C. or higher under atmospheric pressure, having preferably two or more ethylenically unsaturated bonds, and various known monomers curable by irradiation of an active energy ray can be used.

Specific examples of such monomers having two or more ethylenically unsaturated bonds include ⓐ acrylic acid esters or methacrylic acid esters of polyfunctional epoxy resins having two or more epoxy groups in one molecule, ⓑ acrylic acid esters or methacrylic acid esters of alkyleneoxide addition products of polyhydric alcohols, ⓒ polyester acrylates having acrylic acid ester group at the terminal ends of the molecular chains of polyesters having molecular weights of 500 to 3000 comprising dibasic acid and dihydric alcohol, ⓓ the reaction products between polyisocyanates and acrylic acid monomers having hydroxyl groups. The above monomers ⓐ–ⓓ may be urethane-modified products having urethane bonds in the molecules.

Examples of the monomers belonging to ⓐ include acrylic acid or methacrylic acid esters of polyfunctional epoxy resins to be used for formation of the epoxy resin as hereinafter described.

Examples of the monomers belonging to ⓑ include ethyleneglycol di(meth)acrylate, diethyleneglycol di(meth)acrylate, polyethyleneglycol di(meth)acrylate, 1,6-hexanediol di(meth)acrylate, polyethyleneglycol di(meth)acrylate, pentaerythritol tri(meth)acrylate and the like, and those known under the trade names of KAYARAD HX-220, HX-620, D-310, D-320, D-330, DPHA, R-604, DPCA-20, DPCA-30, DPCA-60, DPCA-120 (all produced by Nippon Kayaku K.K.), and also those known under the trade names of NK ester BPE-200, BPE-500, BPE-1300, A-BPE-4 (all produced by Shin Nakamura Kagaku K.K.), etc., may also be available.

The monomers belonging to ⓒ may be exemplified by those known under the trade names of Aronix M-6100, M-6200, M-6250, M-6300, M-6400, M-7100, M-8030, M-8060, M-8100 (all produced by Toa Gosei Kagaku K.K.). Examples of the monomers belonging to ⓒ and having urethane bonds of polyester include those known under the trade names of Aronix M-1100, Aronix M-1200, (both produced by Toa Gosei Kagaku K.K.).

The monomers belonging to ⓓ may include the reaction products between polyisocyanates, such as tolylene diisocyanate, isophorone diisocyanate, hexamethylene diisocyanate, trimethylhexamethylene diisocyanate, lysine diisocyanate, diphenylmethane diisocyanate or the like, with a hydroxyl containing acrylic monomer, and it is possible to use the reaction products having (meth)acrylic acid esters containing hydroxyl group(s) added to polyisocyanate compounds known under the trade names of Sumidule N (buret derivative of hexamethylene diisocyanate), Sumidule L (trimethylolpropane modified product of tolylene diisocyanate) (all produced by Sumitomo Bayer Urethane K.K.), etc. The hydroxyl containing acrylic monomer as herein mentioned may include typically (meth)acrylic acid esters, preferably hydroxyethyl (meth)acrylate, hydroxypropyl (meth)acrylate. It is also possible to use other acrylic monomers containing hydroxyl group(s) mentioned in the present specification as useful for the graft chains in the graft copolymerized polymer.

In addition to the monomers having two or more ethylenically unsaturated bonds as mentioned above, it is also possible to use monomers having only one ethylenically unsaturated bond as mentioned below together with these monomers. To exemplify such monomers having one ethylenically unsaturated bond, there may be included, for example, carboxyl containing unsaturated monomers such as acrylic acid, methacrylic acid or the like; glycidyl containing unsaturated monomers such as glycidyl acrylate, glycidyl methacrylate or the like; $C_2$–$C_8$ hydroxyalkyl esters of acrylic acid or methacrylic acid such as hydroxyethyl acrylate, hydroxyethyl methacrylate, hydroxypropyl acrylate, hydroxypropyl methacrylate or the like; monoesters of acrylic acid or methacrylic acid with polyethyleneglycol or polypropyleneglycol such as polyethyleneglycol monoacrylate, polyethyleneglycol monomethacrylate, polypropyleneglycol monoacrylate, polypropyleneglycol monomethacrylate or the like; $C_1$–$C_{12}$ alkyl or cycloalkyl esters of acrylic acid or methacrylic acid such as methyl acrylate, ethyl acrylate, propyl acrylate, isopropyl acrylate, butyl acrylate, hexyl acrylate, octyl acrylate, lauryl acrylate, cyclohexyl acrylate, methyl methacrylate, ethyl methacrylate, propyl methacrylate, isopropyl methacrylate, butyl methacrylate, hexyl methacrylate, octyl methacrylate, lauryl methacrylate, cyclohexyl methacrylate or the like; other monomers such as styrene, vinyltoluene, methylstyrene, vinyl acetate, vinyl chloride, vinyl isobutyl ether, acrylonitrile, acrylamide, methacrylamide, acrylic acid or methacrylic acid adduct of alkylglycidyl ether, vinylpyrrolidone, dicyclopentenyloxyethyl(meth)acrylate, ε-caploractone-modified hydroxyalkyl(meth)acrylate, tetrahydrofurfulyl acrylate, phenoxyethyl acrylate; and others.

By use of the above monomer (ii) having ethylenically unsaturated bonds, high sensitivity and satisfactory curability to an active energy ray can be imparted to the composition of the present invention.

The epoxy resin (iii) comprising one or more compounds having one or more epoxy groups in one molecule, to be used in the resin composition of the present invention, is a component which permits the composition of the present invention to exhibit high sensitivity and satisfactory curability with an active energy ray alone or together with the monomer (ii) having ethylenically unsaturated bonds as described above by the action of the polymerization initiator (iv) as described hereinafter and, in addition thereto, imparts better adhesiveness with a substrate, water resistance, chemical resistance, dimensional stability, etc., to the cured film, when it is formed by coating the resin composition of the present invention in liquid state on various substrates comprising glass, plastics, ceramics, etc., followed by curing, or when it is used in the form of a dry film adhered on various substrates.

In the resin composition of the present invention, any epoxy resin comprising at least one compound containing one or more epoxy group in one molecule can be used without particular limitation. However, in view of, for example, chemical resistance or mechanical strength of the cured film obtained by curing of the resin composition of the present invention, or high durability as a construction material, or in view of workability during formation of various patterns comprising the cured film of the composition on a substrate or resolution of the patterns formed, it is preferable to use an epoxy resin comprising at least one kind of compound containing two or more epoxy groups in one molecule.

Examples of the above epoxy resin containing 2 or more epoxy groups in one molecule include epoxy resins as represented by the bisphenol A type, novolac type, alicyclic type, or polyfunctional epoxy resins such as bisphenol S, bisphenol F, tetrahydroxyphenylmethane tetraglycidyl ether, resorcinol diglycidyl ether, glycerine triglycidyl ether, pentaerythritol triglycidyl ether, isocyanuric acid triglycidyl ether and epoxyurethane resins represented by the following formula II:

$$CH_2\underset{O}{-}CH-CH_2-O+R-O-\underset{\underset{O}{\|}}{C}-NH-R_0-NH-\underset{\underset{O}{\|}}{C}-O-R\underset{n}{+}O-CH_2-CH\underset{O}{-}CH_2 \qquad (II)$$

(wherein R represents an alkyl group or an oxyalkyl group, $R_0$ represents

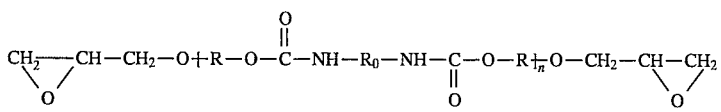

or an alkyl group), and mixtures of at least one of them.

Specific examples of these polyfunctional epoxy resins include those as mentioned below. That is, the bisphenol A type epoxy resin may be, for example, Epicoat 828, 834, 871, 1001, 1004 (trade names, produced by Shell Chemical Co.), DER 331-J, 337-J, 661-J, 664-J, 667-J (produced by Dow Chemical Co.) and Epicrone 800 (trade name, produced by Dainippon Ink Kagaku K.K.), etc. The novolac type epoxy resin may be, for example, Epicoat 152, 154, 172 (trade names, produced by Shell Chemical Co.), Allaldite EPN 1138 (trade name, produced by Ciba Geigy Co.), DER 431, 438 and 439 (trade names, produced by Dow Chemical Co. ), etc. The alicyclic epoxy resin may be, for example, Araldite CY-175, -176, -179, -182, -184, -192 (trade names, produced by Ciba Geigy Co. ), Chissonox 090, 091, 092, 301, 313 (trade names, produced by Chisso K.K.), CYRACURE 6100, 6110, 6200 and ERL 4090, 4617, 2256, 5411 (trade names, produced by Union Carbide Co.), etc. The polyglycidyl ether by aliphatic polyhydric alcohol may be, for example, ethyleneglycol diglycidyl ether, polyethyleneglycol diglycidyl ether, propyleneglycol diglycidyl ether, polypropyleneglycol diglycidyl ether, neopentylglycol diglycidyl ether, 1,6-hexanediol diglycidyl ether, glycerine diglycidyl ether, trimethylolpropane triglycidyl ether, diglycidyl ether of hydrogenated bisphenol A, 2,2-dibromoneopentylglycol diglycidyl ether etc.; the polyglycidyl ether derived from aromatic polyhydric alcohol may be, for example, diglycidyl ether of an addition product of bisphenol A added with 2 to 16 mols of alkyleneoxide, a diglycidyl ether of an addition product of bisphenol F added with 2 to 16 mols of alkyleneoxide, a diglycidyl ether of an addition product of bisphenol S added with 2 to 16 mols of alkyleneoxide.

On the other hand, examples of the compounds containing one epoxy group in one molecule include olefin oxide, octylene oxide, butyl glycidyl ether, glycidyl methacrylate, allyl glycidyl ether, styrene oxide, phenyl glycidyl ether, n-butylphenol glycidyl ether, 3-pentadecylphenyl glycidyl ether, cyclohexenevinyl monooxide, α-pinene oxide, glycidyl ester of tert-carboxylic acid and mixtures thereof.

These monofunctional epoxy resins can be used together with the polyfunctional epoxy resin as mentioned above or also individually alone.

In the resin composition of the present invention, the above epoxy resin (iii) has high sensitivity and satisfactory curability to an active energy ray generated by the action of the Lewis acid, which is generated by irradiating the polymerization initiator (iv) as described below with the active energy ray, on the epoxy groups of the resin, thereby enabling precise and high resolution pattern formation with the composition of the present invention through its curability together with the monomer (ii) having ethylenically unsaturated bonds as described above, but also in addition thereto imparting good adhesion to a substrate, chemical resistance, dimensional stability, etc., through heat curability possessed inherently by the epoxy resin.

The polymerization initiator (iv) capable of generating a Lewis acid by irradiation of an active energy ray to be used in the resin composition of the present invention is a component for curing the epoxy resin (iii) as mentioned above with the action of the Lewis acid, which permits the resin composition of the present invention to exhibit high sensitivity and satisfactory curability to an active energy ray together with the monomer (ii) having ethylenically unsaturated bond(s) as described above. As such a polymerization initiator (iv), there may be preferably used, for example, aromatic onium salt compounds having photosensitivity containing an element belonging to Group VIa as disclosed in Japanese Patent Publication No. 52-14278 or aromatic onium salt compounds having photosensitivity containing an element belonging to Group Va as shown in Japanese Patent Publication No. 52-14279, or aromatic halonium salts having photosensitivity as shown in Japanese Patent Publication No. 52-14277. These aromatic onium salt compounds or aromatic halonium salts all have the characteristic of curing the epoxy resin (iii) by releasing a Lewis acid by irradiation with an active energy ray.

The aromatic onium salt compounds having photosensitivity of the element belonging to Group VIa or Group Va may include typically the compounds of the following formula III:

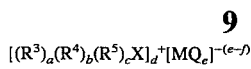    (III)

(wherein $R^3$ is a monovalent organic aromatic group, $R^4$ is a monovalent organic aliphatic group selected from alkyl groups, cycloalkyl groups and substituted alkyl groups, $R^5$ is a polyvalent organic group for constituting heterocyclic or fused ring structures selected from aliphatic groups and aromatic groups, X is an element belonging to the Group VIa selected from sulfur, selenium and tellurium or an element belonging to Group Va selected from nitrogen, phosphorus, arsenic, antimony and bismuth, M is a metal or metalloid and Q is halogen, a is an integer of 0 to 3 when X is an element belonging to Group VIa or an integer of 0 to 4 when X is an element belonging to Group Va, b is an integer of 0 to 2, c is an integer of 0 or 1 when X is an element belonging to Group VIa or an integer of 0 to 2 when X is an element belonging to Group Va, f is an integer of 2 to 7 representing the valence of M, e is an integer which is greater than f but not more than 8, and the sum of a, b and c is 3 when X is an element belonging to Group VIa or 4 when X is an element belonging to Group Va, and d=e–f).

On the other hand, the photosensitive aromatic halonium salt may be exemplified by the following formula IV:

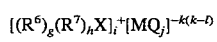    (IV)

(wherein $R^6$ is a monovalent aromatic organic group, $R^7$ is a divalent aromatic organic group, X is halogen, M is a metal or metalloid and Q is halogen, respectively, g is an integer of 0 or 2 and h is an integer of 0 or 1, with the sum of g and h being equal to 2 or the valence of X, i being equal to k–l, l is an integer of 2 to 7 which is equal to the valence of M and k is an integer of up to 8 which is greater than l).

Specific examples of the photosensitive aromatic onium salt compounds containing an element belonging to Group VIa or the group Va which can be formulated in the resin composition of the present invention may include the photosensitive aromatic onium salts of the elements belonging to Group VIa as shown below:

a) 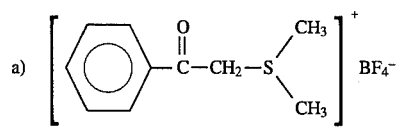

b) 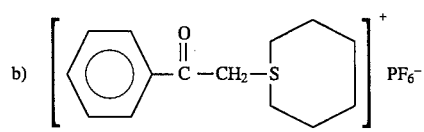

c) 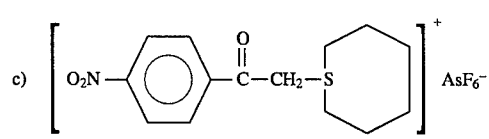

d) 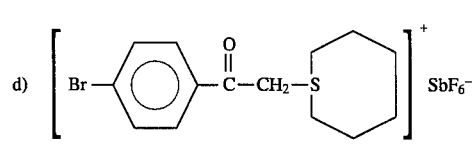

e) 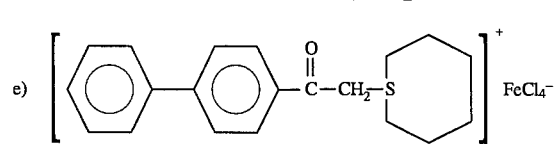

f) 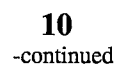 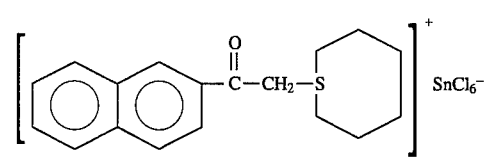

g) 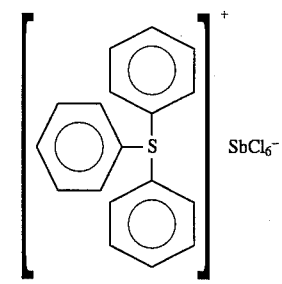

h) 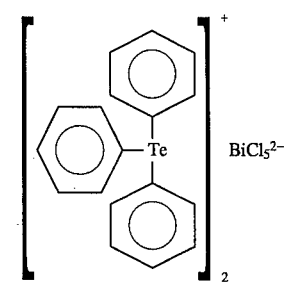

i) 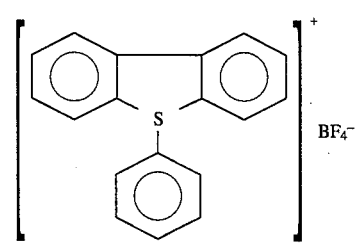

j) 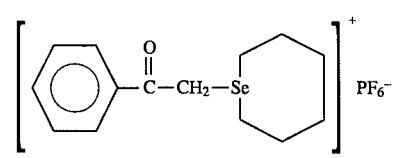

and photosensitive aromatic onium salts of the elements belonging to Group Va as shown below:

1) 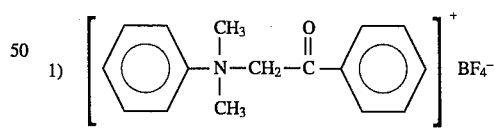

2) 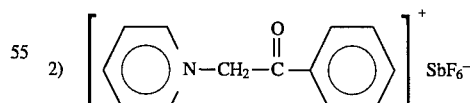

3) 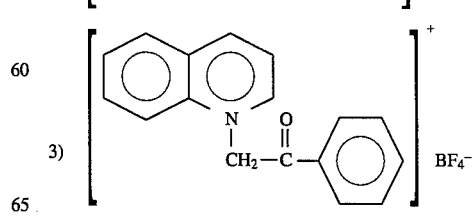

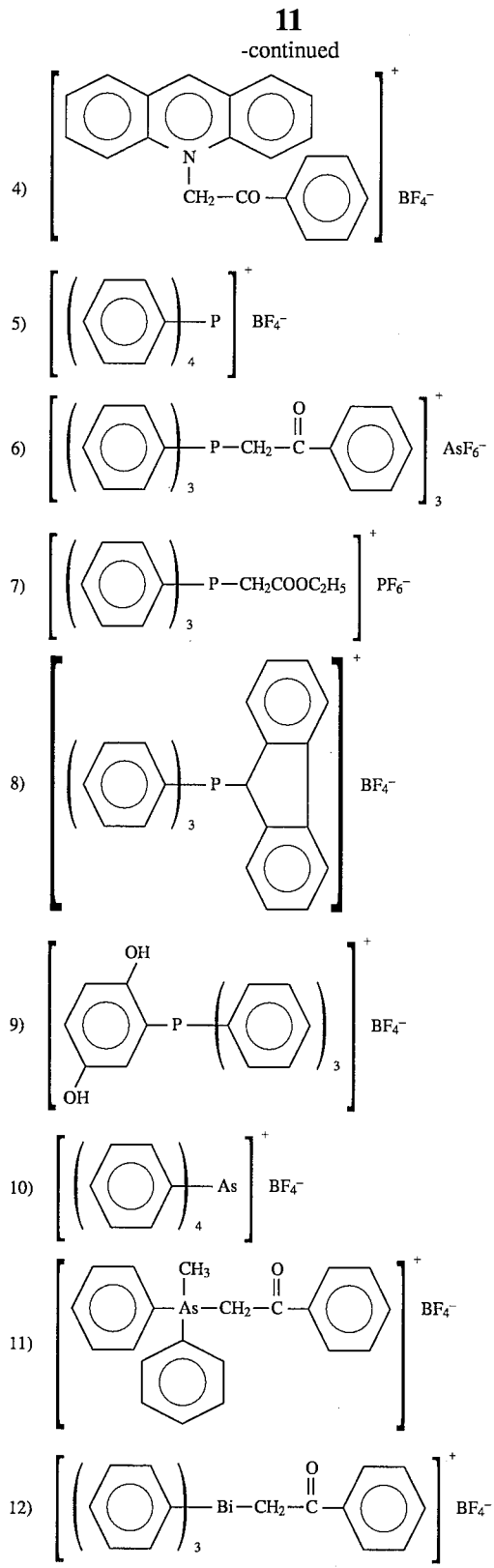

Specific example of the photosensitive aromatic halonium salts include, for example,

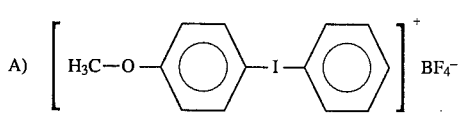

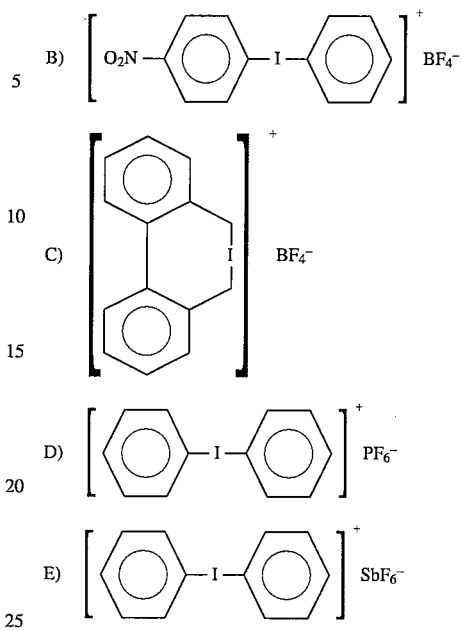

In addition to the polymerization initiator (iv) releasing a Lewis acid as described above, it is also possible to employ, if desired, curing agents generally employed widely as the curing agent for epoxy resins, such as polyamine, polyamide, acid anhydride, boron trifluoride-amine complex, dicyandiamide, imidazoles, complexes of imidazole with metal, etc.

The active energy ray to be used for curing of the active energy ray-curing resin composition of the present invention may include ultraviolet rays (UV-rays) or electron beams which have widely been practically applied. As the UV-ray light source, there may be employed high pressure mercury lamps, ultra-high pressure mercury lamps, metal halide lamps, etc., enriched in light with wavelength of 250 nm to 450 nm, preferably those which can give a light intensity of about 1 mW/cm$^2$ to 100 mW/cm$^2$ at the wavelength in the vicinity of 365 nm at a distance between the lamp and the material to be irradiated which is practically permissible. The electron beam irradiation device is not particularly limited, but a device having a dose within the range of 0.5 to 20M Rad is practically suitable.

The active energy ray-curing resin composition of the present invention can be cured by an active energy ray as described above, and a radical polymerization initiator capable of forming organic free radicals which can be activated by the action of an active energy ray may be added in the resin composition, in addition to the polymerization initiator (iv) as herein mentioned, for the purpose of imparting further excellent curability to an active energy ray to the monomer (ii) having ethylenically unsaturated bonds as described above, or when employing a graft copolymerized polymer (i) having photopolymerizability. Particularly, in the case when employing a graft copolymerized polymer (i) having photopolymerizability and an active energy ray with a wavelength of 250 nm to 450 nm, it is preferable to use the radical polymerization initiator as mentioned above together with the above polymerization initiator (iv). As the radical polymerization initiator, known substances having the property of being activated with an active energy ray, forming organic free radicals and initiating radial polymerization can be used without any particular limitation.

Specific examples of such radical polymerization initiators include benzyl, benzoin alkyl ethers such as benzoin isobutyl ether, benzoin isopropyl ether, benzoin-n-butyl ether, benzoin ethyl ether, benzoin methyl ether and the like; benzophenones such as benzophenone, 4,4'-bis(N,N-diethylamino)benzophenone, benzophenone methyl ether and the like; anthraquinones such as 2-ethylanthraquinone, 2-t-butylanthraquinone and the like; xanthones such as 2,4-dimethylthioxanthone, 2,4-diisopropylthioxanthone and the like; acetophenones such as 2,2-dimethoxy-2-phenylacetophenone, α,α- dichloro-4-phenoxyacetophenone, p-tert-butyltrichloroacetophenone, p-tert-butyldichloroacetophenone, 2,2-diethoxyacetophenone, p-dimethylaminoacetophenone and the like; or hydroxycyclohexylphenyl ketone (e.g., Irugacure 184, produced by Ciba Geigy Co.), 1-(4-isopropylphenyl)-2-hydroxy-2-methylpropane-1-one (e.g. propane-1-one (Darocure 1173, produced by MERCK Co.); etc., as preferable ones. In addition to these radical polymerization initiators, amino compounds may be added as the photopolymerization accelerator.

The amino compounds to be used as the photopolymerization accelerator may include ethanolamine, ethyl-4-dimethylaminobenzoate, 2-(dimethylamino)ethylbenzoate, p-dimethylaminobenzoic acid n-amylester, p-dimethylaminobenzoic acid isoamyl ester, etc.

The constitutional ratio of the above materials constituting the active energy ray-curing resin composition of the present invention may be preferably such that G/(G+M+E) is within the range from 0.2 to 0.8 and E/(E+M) is within the range from 0.3 to 0.7, wherein G is the content in parts by weight, for the graft copolymerized polymer (i), M for the monomer having ethylenically unsaturated bonds (ii) and E for the epoxy resin (iii), and the polymerization initiator (iv) preferably 0.2 to 15 parts by weight per 100 parts by weight of (G+M+E) (in the above formula, either one of M and E may be zero).

If G/(G+M+E) is smaller than 0.2, the content of the graft copolymerized polymer in the resin composition becomes so small that satisfactory adhesiveness with a substrate based on the graft copolymerized polymer can not be exhibited, or the drying property of the solvent when employing a solvent may be worsened to make the surface of the pattern obtained by curing sticky. On the other hand, if G/(G+M+E) is in excess of 0.8, the content of the monomer having ethylenically unsaturated bond(s) and the epoxy resin in the resin composition of the present invention is reduced, whereby sensitivity to the active energy ray may be lowered to retard curing speed during pattern formation, or lower resolution of the pattern formed, and the pattern obtained by curing may be lowered in mechanical strength and chemical resistance.

When a radical polymerization initiator activated by the action of an activation energy ray is used in the resin composition of the present invention, the polymerization initiator may be added in an amount within the range from 0.1 to 20 parts by weight, preferably from 1 to 10 parts by weight based on 100 parts by weight of the resin components comprising the graft copolymerized polymer (i), the monomer having ethylenically unsaturated bonds (ii) and the epoxy resin (iii) [(i)+(ii)+(iii)]. In the above formula, the case when either one of (ii) and (iii) is zero is also included.

AS the solvent to be used when employing the active energy ray-curing resin composition of the present invention in the form of a solution or when coating the composition on a plastic film which is a film substrate in formation of a dry film, hydrophilic solvents such as alcohols, glycol ethers, glycol esters, etc., may be employed. Of course, it is also possible to use mixtures comprising these hydrophilic solvents as the main component, mixed optionally at appropriate proportions with ketones such as methyl ethyl ketone, methyl isobutyl ketone, etc., esters such as ethyl acetate, isobutyl acetate, etc., aromatic hydrocarbons such as toluene, xylene, etc., and their halogen derivatives, aliphatic solvents containing chlorine such as methylene chloride, 1,1,1-trichloroethane, etc. These solvents can be also used as the developer for the composition of the present invention.

The active energy ray-curing resin composition of the present invention may further contain in addition to the above radical polymerization initiator or the solvent as described above, additives such as catalysts for condensation crosslinking, heat polymerization inhibitors, colorants (dyes and pigments), fine particulate fillers, adhesion promotors, plasticizers, etc., if desired.

The condensation crosslinking catalyst may include sulfonic acids, typically p-toluenesulfonic acid, carboxylic acids such as formic acid, etc. The heat polymerization inhibitor may include hydroquinone and derivatives thereof, p-methoxyphenol, phenothiazine, etc. As the colorant there can be added oil-soluble dyes and pigments within the range which do not substantially prevent transmission of the active energy ray. As the filler, for enhancement of hardness of coating, as well as for enhancement of coloration, adhesion, and mechanical strength, there may be employed extender pigments, plastic fine particles, etc., which are used in coating materials in general. As the adhesion promotor, silane coupling agents, and low molecular weight surfactants as inorganic surface modifiers may be effectively used in the composition of the present invention.

The active energy ray-curing resin composition of the present invention as described above can be used according to the methods as exemplified below.

1) The composition of the present invention is applied on a substrate to a desired thickness within the range from 1 to 100 μm, the solvent is dried by evaporation and then an active energy ray is irradiated. Then, the substrate is heated at 80° C. or higher for about 10 minutes to 3 hours. When a heat curable graft copolymerized polymer is employed, the heat treatment temperature is made at least 100° C.

2) The composition of the present invention is applied on a substrate to a desired thickness of 1 to 100 μm, followed by drying through evaporation of the solvent. Subsequently, a mask pattern with a transmittance of the active energy ray of at least 1% or less is closely contacted on the composition, and an active energy ray is irradiated from above the mask. Then, development is effected with a developer dissolving the composition to remove the non-irradiated portion. Then, the substrate is heated at a temperature of at least 80° C. for about 10 minutes to 3 hours. When a heat curable graft copolymerized polymer is used, the treatment temperature is made at least 100° C.

3) When the composition of the present invention is provided for practical application in the mode of a dry film, it is generally suitable to support the composition with a film-shaped substrate. The film-shaped substrate to be used in this case may include, for example, 16 μm–100 μm biaxially stretched polyethylene terephthalate film, cellulose triacetate, poly-1-vinylfluoride, polyvinyl chloride, polyvinylidene chloride, poly-4-methylpentene-1, polyethylene, polypropylene and laminates or co-extruded films thereof as useful ones. As the laminating method during fabrication of a dry film by laminating the composition on the film-shaped substrate as mentioned above, there may be employed well-known methods such as the coating method by use of roll coater, bar coater, etc., dipping, spray coating, brush coating, etc.

As the method for forming a pattern by use of such a dry film, for example, a dry film is secured on a desired substrate such as a printed-wiring board on which the pattern is to be formed by means of a laminating device which can perform heating and pressurization. Next, imagewise exposure is effected by irradiation of an active energy ray after application of a masking, with or without removal of the film-shaped substrate of the dry film, or by selective irradiation of the active energy ray. Subsequently, the non-irradiated portion is removed with a solvent which can dissolve the dry film. Then, the substrate is heated at a temperature of 80° C. or higher for about 10 minutes to 3 hours. When a heat curable graft copolymerized polymer is used, the temperature for this heating treatment is made at least 100° C.

The active energy ray-curing resin composition of the present invention has very excellent sensitivity and resolution to an active energy ray as a pattern forming material imparted primarily by the monomer having ethylenically unsaturated bonds (ii) and/or the epoxy resin (iii) and the polymerization initiator capable of generating a Lewis acid (iv) as the components, and a high precision and high resolution pattern can be formed by use thereof.

Moreover, in the active energy ray-curing resin composition of the present invention, also the characteristics of the graft copolymerized polymer (i) and the epoxy resin (iii) optionally added are effectively exhibited, namely having excellent chemical resistance and dimensional stability imparted primarily by the epoxy resin (iii) in addition to excellent adhesion to the substrate and mechanical strength imparted primarily by the graft copolymerized polymer (i), and the pattern formed by the composition has these excellent properties when viewed as the coating material, which is suitable for protective coating or structural material for which a long term durability is demanded.

Also, when a graft copolymerized polymer having curability is used, it is possible to obtain an active energy ray curing resin composition which is further excellent in adhesiveness, mechanical strength and chemical resistance as mentioned above.

The active energy ray-curing resin composition of the present invention can be used for protective coating of glass, adhesive, insulating layers of liquid crystal display devices, or surface modification such as transparent coloration or opaque coloration on glass plate, imparting of water-proofness, water repellency, anti-stain property, etc. Also, by making available excellent chemical resistance, it is useful as the masking material for glass etching or metallizing such as electroless copper plating, etc., solder mask for printed-wiring board, etc. It is also useful for formation of minute liquid pathways, cooling pathways or nozzles utilizing water resistance, particularly for formation of nozzles in ink-jet recording heads. Further, it is possible to obtain a photosensitive liquid or dry film for screen process printing which can be used for both aqueous and oily inks having high durability incomparable with other materials.

The present invention is described in more detail by referring to the following Examples.

EXAMPLE 1

A living polymer (2-hydroxyethyl methacrylate/butyl acrylate=80/20 weight ratio) obtained by anion polymerization was allowed to react with p-vinylbenzylchloride to obtain a macromonomer (p-vinylbenzylpoly-2-hydroxyethyl methacrylate/butyl acrylate) with a weight average molecular weight of about 1800 having a vinyl group at one terminal end of the molecular chain. Solution polymerization of 30 parts by weight of the macromonomer and 70 parts by weight of methyl methacrylate in methyl cellosolve gave a thermoplastic graft copolymerized polymer having a weight average molecular weight of $7.0 \times 10^4$ (this is called GP-1). The polymethyl methacrylate chain constituting the main chain of the GP-1 has a glass transition point of 100° C.

By use of the GP-1, an active energy ray curing type resin composition was prepared as follows.

| GP-1 | 100 parts by weight |
| Epikote 1001*[1] | 25 parts by weight |
| Celloxide 2021*[2] | 25 parts by weight |
| Trimethylolpropane triacrylate | 50 parts by weight |
| Triphenylsulfonium tetrafluoroborate | 10 parts by weight |
| Irgacure 651 | 15 parts by weight |
| Crystal Violet | 1 parts by weight |
| Hydroquinone | 0.2 parts by weight |
| Methyl cellosolve acetate | 300 parts by weight |

*[1]: Bisphenol A type epoxy resin produced by Yuka-Shell Epoxy K.K.; epoxy equivalent, 450–500
*[2]: Alicyclic type epoxy resin produced by Dicell Kagaku K.K.; epoxy equivalent, 128–145

The composition was applied by a bar coater on a 16 μm polyethylene terephthalate film (Lumilar T type) to a thickness after drying of 20 μm. The coated film was protected by pressure lamination of a 25 μm polyethylene film thereon. A 4-inch silicon wafer having a heat-oxidized film with a thickness of 5000 Å formed on the surface was washed by sonication in 1,1,1-trichloroethane and dried. Then, while preheating the silicon wafer at 80° C. the film as described above was laminated thereon by means of a hot roll type laminator (HRL-24, produced by Du Pont Co.) at a roll temperature of 80° C. roll pressure of 1 Kg/cm² and a laminate speed of 1 m/min while peeling off the polyethylene film therefrom. Then, with a mask for resolution test closely contacted thereon, exposure was effected for 40 seconds by means of an exposure light source for semiconductor using a deep UV lamp with a luminosity on the irradiated surface of 8 mW/cm² (PLA-5-1, produced by Canon K.K.). After exposure, the polyethylene terephthalate film was peeled off and development was carried out according to the spray system with the use of a mixture of 1,1,1-trichioroethane/ethanol (=70/30 weight ratio) at 35° C. for 60 seconds. The resin composition after development, was found to reproduce accurately the pattern of line/interval with width of 100 μm. Then, the substrate was heated and dried at 80° C., subjected to post-exposure of 10 J/cm² and further heated at 150° C. for 60 minutes to cure fully the resin composition.. As the next step, the resin layer was completely cut by means of a dicing saw for production of semiconductors (DAD-2H/6, produced by DISCO Co.) with a diamond blade (thickness 0.040 mm) at a delivery speed of 3 mm/sec to be cut to the depth of the substrate. The cured film without pattern was cut into checkers at 0.5 mm pitches and the pattern portion was also cut at 0.5 mm pitches so as to divide the patterns.

When the tape peel-off test was practiced on the cured film having no pattern by use of an industrial cellophane tape on the substrate, the result obtained was 100/100, indicating good adhesiveness. When the pattern cross-section was observed by a microscope, the side face of the pattern was found to have a shape substantially perpendicular to the substrate and useful as a construction material.

Next, the substrate was dipped in an NaOH aqueous solution of pH=10 and a solution of diethyleneglycol/water (=50/50 weight ratio), and the pressure cooker test was practiced under the conditions of 121° C., 2 atm. and 20 hours. After the pressure cooker test, the substrate was washed and dried in air, followed by the tape peel-off test. As a result, in either test solution, 100/100 adhesiveness was exhibited and no denaturation such as whitening, blistering, etc., of the coating was recognized at all, thus indicating excellent chemical resistance and alkali resistance.

EXAMPLE 2

A living polymer (N-methylolmethacrylamide/2-hydroxyethyl methacrylate=30/70 weight ratio) obtained by anion polymerization was allowed to react with p-vinylbenzylchloride to obtain a macromonomer (p-vinylbenzyl poly-N-methylol-methacrylamide/2-hydroxyethyl methacrylate) with a weight average molecular weight of about 1500 having a vinyl group at one terminal end of the molecular chain.

Solution polymerization of 30 parts by weight of the macromonomer and 70 parts by weight of methyl methacrylate in methyl cellosolve gave a heat crosslinkable graft copolymerized polymer having a weight average molecular weight of $7.7 \times 10^4$ (this is called GP-2). The polymethyl methacrylate chain constituting the main chain of the GP-2 has a glass transition point of 100° C. By use of the GP-2, an active energy ray curing type resin composition having the following composition was prepared.

| | |
|---|---|
| GP-2 | 100 parts by weight |
| Epikote 828*[3] | 30 parts by weight |
| Epikote 152*[4] | 30 parts by weight |
| Neopenthylglycol diacrylate | 40 parts by weight |
| Triphenylsulfonium tetrafluoroborate | 10 parts by weight |
| Benzophenone | 10 parts by weight |
| Micheler's ketone | 5 parts by weight |
| Crystal violet | 1 parts by weight |
| Hydroquinone | 0.1 parts by weight |
| P-toluenesulfonic acid | 5 parts by weight |
| Methyl cellosolve acetate | 350 parts by weight |

*[3]:bisphenol A type epoxy resin produced by Yuka-Shell Epoxy K.K.; epoxy equivalent, 183–193
*[4]:cresol-novolac type epoxy resin produced by Yuka-Shell Epoxy K.K.; epoxy equivalent, 172–179

The composition was applied by a bar coater on a 16 μm polyethylene terephthalate film (Lumilar T type) to a thickness after drying of 20 μm. The coated film was protected by pressure lamination of a 25 μm polyethylene film thereon. A silicon wafer having a polyimide film (1 μm thickness, Photoniece UR-3100, produced by Toray K.K.) formed thereon was washed by sonication in 1,1,1-trichloroethane and dried. Then, while preheating the silicon wafer at 80° C., the film as described above was laminated thereon by means of a hot roll type laminator (HRL-24, produced by Du Pont Co.) at a roll temperature of 80° C., roll pressure of 1 Kg/cm² and a laminate speed of 1 m/min while peeling off the polyethylene film therefrom. Then, with a mask for resolution test closely contacted thereon, exposure was effected for 40 seconds by means of an exposure light source for semiconductor using a deep UV lamp with a luminosity on the irradiated surface of 8 mW/cm² (PLA-5-1, produced by Canon K.K.). After exposure, the polyethylene terephthalate film was peeled off and development was carried out according to the spray system with the use of a mixture of 1,1,1-trichloroethane/ethanol (=70/30 weight ratio) at 35° C. for 60 seconds. The resin composition after development was found to reproduce accurately the pattern of line/interval with width of 100 μm. Then, the substrate was heated and dried at 80° C., subjected to post-exposure of 10 J/cm² and further heated at 150° C. for 60 minutes to cure fully the resin composition.

As the next step, the resin layer was completely cut by means of a dicing saw for production of semiconductors (DAD-2H/6, produced by DISCO Co.) with a diamond blade (thickness 0.040 mm) at a delivery speed of 3 mm/sec to be cut the depth of the substrate. The cured film without pattern was cut into checkers at 0.5 mm pitches, and the pattern portion was also cut at 0.5 mm pitches so as to cut the patterns.

When the tape peel-off test was practiced on the effective film having no pattern by use of an industrial cellophane tape on the substrate, the result obtained was 100/100, indicating good adhesiveness. When the pattern cross-section was observed by a microscope, the side face of the pattern was found to have a shape substantially perpendicular to the substrate and useful as a construction material.

Next, the substrate was dipped in an NaOH aqueous solution of pH=10 and a solution of diethyleneglycol/water (=50/50 weight ratio), and the pressure cooker test was practiced under the conditions of 121° C., 2 atm,.and 20 hours. After the pressure cooker test, the substrate was washed and dried on air, followed by the tape peel-off test. As a result, in either test solution, 100/100 adhesiveness was exhibited and no denaturation such as whitening, blistering, etc., of the coating was recognized at all, thus indicating excellent chemical resistance and alkali resistance.

EXAMPLE 3

A living polymer (3-chloro-2-hydroxypropyl methacrylate/N-vinylpyrrolidone=90/10 weight ratio) obtained by anion polymerization was allowed to react with acrylic acid chloride to obtain a macromonomer (acrylic acid poly-3-chloro-2-hydroxypropyl methacrylate/N-vinylpyrrolidone) with a weight average molecular weight of about 2500 having a vinyl group at one terminal end of the molecular chain. Copolymerization of 25 parts by weight of the macromonomer, 65 parts by weight of methyl methacrylate and 10 parts by weight of dimethylaminoethyl methacrylate was carried out in methyl isobutyl ketone (weight average molecular weight: $6.5 \times 10^4$). Subsequently, to the polymer solution containing 100 parts by weight of the copolymer dissolved therein, 11 parts by weight of a partial urethane compound obtained by the reaction of hexamethylene diisocyanate and 2-hydroxyethyl acrylate to a ratio of NCO group equivalent: OH group equivalent=2.0:1.1 was added to carry out the reaction, whereby 30% of the 3-chloro-2-hydroxypropyl methacrylate component was converted to the acrylic urethane to give a graft copolymerized polymer having photopolymerizable acrylic ester groups at the graft chains (this is called GP-3). The copolymerized polymer chain of methyl methacrylate and dimethylaminoethyl methacrylate constituting the main chain of the GP-3 has a glass transition point of 90° C.

By use of the above GP-3, an active energy ray curing type resin composition was prepared as follows.

| | |
|---|---|
| GP-3 | 100 parts by weight |
| Epicrone 840*[5] | 20 parts by weight |
| Epicrone 830*[6] | 20 parts by weight |
| Epicrone N-730*[7] | 20 parts by weight |
| Acrylic acid ester of triglycidyl ether of trimethylolpropane | 40 parts by weight |
| Diphenyliodonium tetrafluoroborate | 10 parts by weight |
| Irgacure 651 | 15 parts by weight |
| Crystal Violet | 1 parts by weight |
| Hydroquinone | 0.2 parts by weight |
| Methyl cellosolve acetate | 300 parts by weight |

*[5]:bisphenol A type epoxy resin produced by Dainippon Ink Kagaku Kogyo K.K.: epoxy equivalent 180–190
*[6]:bisphenol F type epoxy resin produced by Dainippon Ink Kagaku Kogyo K.K.; epoxy equivalent 170–190
*[7]:phenol-novolac type epoxy resin produced by Dainippon Ink Kagaku Kogyo K.K.; epoxy equivalent 170–190

The composition was applied by a bar coater to a thickness after drying of about 50 μm on a Pyrex glass of 10 cm×10 cm which had been subjected to sonication washing treatment in a washing liquid Difreon (produced by Daikin Kogyo K.K.) and dried. On the surface of this composition, a polyethylene terephthalate film with a thickness of 16 μm (Lumilar T type) was laminated. Next, with a mask for resolution test being placed in close contact thereon, exposure was effected for 20 seconds with a high pressure mercury lamp so that the luminance in the vicinity of 254 nm became 34 mW/cm² on the irradiated surface. After exposure, the polyethylene terephthalate film was peeled off, and development was carried out according to the spray system by use of 1,1,1-trichloroethane at 35° C. for 60 seconds. The resolution of the resin composition after development was found to accurately reproduce the line/interval pattern with a width of 150 μm.

Then, the substrate was dried by heating at 80° C. for 10 minutes, subjected to post-exposure of 10 J/cm² and further to heating at 150° C. for 30 minutes to cure fully the resin composition. When the crosscut tape peel-off test was practiced for the substrate with the use of an industrial cellophane tape, 100/100 adhesiveness was exhibited, indicating complete adhesion except for the clear scars of the crosscuts. The substrate was also dipped in an aqueous NaOH solution of pH=12 at 80° C. for 24 hours, followed by washing with water and drying, and again the crosscut tape peel-off test was practiced. As the result, no lowering in adhesive force such as peel-off, rising, etc., was observed at all.

EXAMPLE 4

A living polymer (N-butoxymethylacrylamide/2-hydroxyethyl methacrylate=70/30 weight ratio) obtained by anion polymerization was allowed to react with acrylic acid chloride to obtain a macromonomer (acrylic acid polybutoxymethylacrylamide/2-hydroxyethyl methacrylate) with a weight average molecular weight of about 3000 having a vinyl group at one terminal end of the molecular chain.

Copolymerization of 25 parts by weight of the macromonomer, 70 parts by weight of methyl methacrylate and 5 parts by weight of acrylonitrile was carried out in methyl cellosolve to obtain a graft copolymerized polymer having heat crosslinkability with a weight average molecular weight of $6.8 \times 10^4$ (this is called GP-4). The copolymerized polymer chain of methyl methacrylate and acrylonitrile constituting the main chain of the GP-4 has a glass transition point of 105° C.

By use of the GP-4 an active energy ray curing type resin composition was prepared as follows.

| | |
|---|---|
| GP-4 | 100 parts by weight |
| Epicrone N-665*[8] | 30 parts by weight |
| Celloxide 2021 | 30 parts by weight |
| Neopentylglycol diacrylate | 40 parts by weight |
| Diphenyliodonium tetrafluoroborate | 10 parts by weight |
| Benzophenone | 10 parts by weight |
| Micheler's ketone | 5 parts by weight |
| Crystal Violet | 1 parts by weight |
| Hydroquinone | 0.1 parts by weight |
| P-toluenesulfonic acid | 5 parts by weight |
| Methyl cellosolve acetate | 300 parts by weight |

*[8]: cresol-novolac type epoxy resin produced by Dainippon Ink Kagaku Kogyo K.K.; epoxy equivalent 200–230

The composition was applied by a bar coater to a thickness of 50 μm after drying on a 16 μm polyethylene terephthalate film (Lumilar T type). An epoxy-copper laminated plate with a thickness of 35 μm subjected to defatting and hydrochloric acid washing treatment was preheated to 80° C., and the above film was laminated by a hot roll type laminator (HRL-24, produced by Du Pont Co.) at a roll temperature of 80° C., a roll pressure of 1 kg/cm² and a laminate speed of 1 m/min. On the laminate obtained the was effected exposure through a negative mask of a circuit pattern by means of the same exposing device as Example 3 for 15 seconds. After exposure, development according to the spray system was carried out with a mixture of 1,1,1-trichloroethane/butyl cellosolve (=70/30) at 35° C. for 60 seconds. The resin composition after development was found to reproduce accurately the pattern of line/interval with a width of 100 μm.

Next, the substrate was dried by heating at 80° C. for 12 minutes, subjected to post-exposure of 10 J/cm² and further to heating at about 150° C. for 60 minutes to cure fully the resin component. Then, by use of ferric chloride of 45° Bohme, etching was practiced at 30° C. under a spray pressure of 1 kg/cm² for 90 seconds to remove copper whereby a circuit of copper was obtained. The resist could be used as such for the protective film of the circuit.

COMPARATIVE EXAMPLE 1

An active energy ray curing type resin composition was prepared as follows.

| | |
|---|---|
| Epikote 1001 | 50 parts by weight |
| Epikote 152 | 20 parts by weight |
| Celloxide 2021 | 30 parts by weight |
| Diphenyliodonium tetrafluoroborate | 10 parts by weight |
| Crystal Violet | 0.3 parts by weight |
| Toluene | 50 parts by weight |
| Methyl ethyl ketone | 100 parts by weight |

The composition was applied to a thickness of about 20 μm after coating by a bar coater on the same wafer as used in Example 1. The film surface after drying was found to be sticky. Next, a 16 μm polyethylene terephthalate film was laminated on the coating, and then a mask for resolution test was placed in close contact thereon, followed by exposure for 150 seconds by use of the same exposing device as in Example 1. After exposure, the polyethylene terephthalate film was peeled off, and development was carried out with a mixture of 1,1,1-trichloroethane/ethanol (=70/30 weight ratio) by a sonication washing machine for 60 seconds. On the resin surface after development, the trace of the mask closely contacted remained as a fine uneven irregular pattern, and even a pattern of line/interval of 150 μm could not be satisfactorily resolved.

COMPARATIVE EXAMPLE 2

A thermoplastic linear polymeric compound with a weight-average molecular weight of $8.8 \times 10^4$ was obtained by polymerization of methyl methacrylate, 2-hydroxyethyl methacrylate and butyl acrylate (=60/30/10 molar ratio) in methyl isobutyl ketone (this is called LP-1). By use of the LP-1, an active energy ray curing type resin composition having the following composition containing no epoxy resin and no polymerization initiator for epoxy resin was prepared.

| | |
|---|---|
| LP-1 | 100 parts by weight |
| Triethyleneglycol dimethacrylate | 50 parts by weight |
| Acrylic acid ester of triglycidyl ether of trimethylolpropane | 50 parts by weight |
| Benzophenone | 10 parts by weight |
| Micheler's ketone | 5 parts by weight |
| Crystal Violet | 0.3 parts by weight |
| Hydroquinone | 0.1 parts by weight |
| Methyl cellosolve | 350 parts by weight |

By use of the composition, pattern formation was performed in entirely the same manner as in Example 1 except for using 1,1,1-trichloroethane for development. The pattern obtained was found to have substantially the same resolution as in Example 1. However, when the pressure cooker test was conducted after cutting by a dicing saw similarly as in Example 1, no cured film was found to remain at all on the substrate when the test sample was taken out from the test solution.

EXAMPLE 5

By use of the GP-1 as shown in Example 1, an active energy ray curing type resin composition was prepared as follows.

| | |
|---|---|
| GP-1 | 100 parts by weight |
| Epikote 1001*[1] | 50 parts by weight |
| Epikote 152*[2] | 20 parts by weight |
| Celloxide 2021*[3] | 30 parts by weight |
| Triphenylsulfonium tetrafluoroborate | 10 parts by weight |
| Crystal Violet | 0.5 parts by weight |
| Hydroquinone | 0.2 parts by weight |
| Toluene | 100 parts by weight |
| Methyl ethyl ketone | 200 parts by weight |

*[1]:bisphenol A type epoxy resin produced by Yuka-Shell Epoxy K.K.; epoxy equivalent, 450–500
*[2]:cresol-novolac type epoxy resin produced by Yuka-Shell Epoxy K.K.; epoxy equivalent, 172–179
*[3]:alicyclic type epoxy resin produced by Dicel Kagaku K.K.; epoxy equivalent 128–145

The composition was applied by a bar coater on a 16 μm polyethylene terephthalate film (Lumilar T type) to a thickness after drying of 20 μm. The coated film was protected by pressure lamination of a 25 μm polyethylene film thereon. A 4-inch silicon wafer having a heat-oxidized film with a thickness of 5000 Å formed on the surface was washed by sonication in 1,1,1-trichloroethane and dried. Then, while preheating the silicon wafer at 80° C., the film as described above was laminated thereon by means of a hot roll type laminator (HRL-24, produced by Du Pont Co.) at a roll temperature of 80° C., roll pressure of 1 Kg/cm$^2$ and a laminate speed of 1 m/min while peeling off the polyethylene film therefrom. Then, with a mask for resolution test closely contacted thereon, exposure was effected for 150 seconds by means of an exposure light source for semiconductor using a deep UV lamp with a luminosity on the irradiated surface of 8 mW/cm$^2$ (PLA-5-1, produced by Canon K.K.). After exposure, the polyethylene terephthalate film was peeled off and development was carried out by a sonication washing machine with the use of a mixture of 1,1,1-trichloroethane/ethanol (=70/30 weight ratio) at 35° C. for 60 seconds. The resin composition after development was found to reproduce accurately the pattern of line/interval with a width of 100 μm. Then, the substrate was heated and dried at 80° C. subjected to post-exposure of 10 J/cm$^2$ and further heated at 150° C. for 60 minutes to cure fully the resin composition. As the next step, the resin layer was completely cut by means of a dicing saw for production of semiconductors (DAD-2H/6, produced by DISCO Co.) with a diamond blade (thickness 0.040 mm) at a delivery speed of 3 mm/sec to be cut to the depth of the substrate. The cured film without pattern was cut into checkers at 0.5 mm pitches, and the pattern portion was also cut at 0.5 mm pitches so as to divide the patterns.

When the tape peel-off test was practiced on the cured film having no pattern and pattern by use of an industrial cellophane tape on the substrate, the result obtained was 100/100, indicating good adhesiveness. When the pattern cross-section was observed by a microscope, the side face of the pattern was found to have a shape substantially perpendicular to the substrate and useful as a construction material.

Next, the substrate was dipped in an NaOH aqueous solution of pH=10 and a solution of diethyleneglycol/water (=50/50 weight ratio), and the pressure cooker test was practiced under the conditions of 121° C., 2 atm. and 20 hours. After the pressure cooker test, the substrate was washed and dried on air, followed by the tape peel-off test. As a result, in either test solution, 100/100 adhesiveness was exhibited and no denaturation such as whitening, blistering, etc., of the coating was recognized at all, thus indicating excellent chemical resistance and alkali resistance.

EXAMPLE 6

By use of the above GP-2, an active energy ray curing type resin composition was prepared as follows.

| | |
|---|---|
| GP-2 | 160 parts by weight |
| Epikote 828*[4] | 20 parts by weight |
| Celloxide 2021 | 20 parts by weight |
| Diphenyliodonium tetrafluoroborate | 5 parts by weight |
| P-toluenesulfonic acid | 4 parts by weight |
| Crystal Violet | 0.5 parts by weight |
| Hydroquinone | 0.1 parts by weight |
| 1,1,1-trichloroethane | 200 parts by weight |
| Methyl cellosolve | 200 parts by weight |

*[4]:bisphenol A type epoxy resin produced by Yuka-Shell Epoxy K.K.; epoxy equivalent 183–193

The composition was applied by a bar coater on a 16 μm polyethylene terephthalate film (Lumilar T type) to a thickness after drying of 20 μm. The coated film was protected by pressure lamination of a 25 μm polyethylene film thereon. A silicon wafer having a polyimide film (1 μm thickness, Photoniece UR-3100, produced by Toray K.K.) formed thereon was washed by sonication in 1,1,1-trichloroethane and dried. Then, while preheating the silicon wafer at 80° C., the film as described above was laminated thereon by means of a hot roll type laminator (HRL-24, produced by Du Pont Co.) at a roll temperature of 80° C., roll pressure of 1 Kg/cm$^2$ and a laminate speed of 1 m/min while peeling off the polyethylene film therefrom. Then, with a mask for resolution test closely contacted thereon, exposure was effected for 150 seconds by means of an exposure light source for semiconductor using a deep UV lamp with a luminosity on the irradiated surface of 8 mW/cm$^2$ (PLA-5-1, produced by Canon K.K.). After exposure, the polyethylene terephthalate film was peeled off and development was carried out by a sonication washing machine with the use of a mixture of 1,1,1-trichloroethane/ethanol (=70/30 weight ratio) at 35° C. for 60 seconds. The resin composition after development was found to reproduce accurately the pattern of line/interval with a width of 100 μm. Then, the substrate was heated and dried at 80° C., subjected to post-exposure of 10 J/cm$^2$ and further heated at 150° C. for 60 minutes to cure fully the resin composition.

As the next step, the resin layer was completely cut by means of a dicing saw for production of semiconductors (DAD-2H/6, produced by DISCO Co.) with a diamond blade (thickness 0.040 mm) at a delivery speed of 3 mm/sec to be cut to the depth of the substrate. The cured film without pattern was cut into checkers at 0.5 mm pitches, and the pattern portion was also cut at 0.5 mm pitches so as to divide the patterns.

When the tape peel-off test was practiced on the cured film having no pattern and pattern by use of an industrial cellophane tape on the substrate, the result obtained was 100/100, indicating good adhesiveness. When the pattern cross-section was observed by a microscope, the side face of the pattern was found to have a shape substantially perpendicular to the substrate and useful as a construction material.

Next, the substrate was dipped in an NaOH aqueous solution of pH=10 and a solution of diethyleneglycol/water (=50/50 weight ratio), and the pressure cooker test was practiced under the conditions of 121° C., 2 atm. and 20 hours. After the pressure cooker test, the substrate was washed and dried on air, followed by the tape peel-off test. As a result, in either test solution, 100/100 adhesiveness was exhibited and no denaturation such as whitening, blistering, etc., of the coating was recognized at all, thus indicating excellent chemical resistance and alkali resistance.

EXAMPLE 7

By use of the above GP-3, an active energy ray curing type resin composition was prepared as follows.

| | |
|---|---|
| GP-3 | 100 parts by weight |
| Epicrone 840*[5] | 50 parts by weight |
| Epicrone N-655*[6] | 50 parts by weight |
| Triphenylsulfonium hexafluoroantimone | 10 parts by weight |
| Crystal Violet | 0.5 parts by weight |
| Hydroquinone | 0.1 parts by weight |
| Methyl isobutyl ketone | 400 parts by weight |

*[5]:bisphenol A type epoxy resin produced by Dainippon Ink Kagaku K.K.; epoxy equivalent 180–190
*[6]:cresol-novolac type epoxy resin produced by Dainippon Ink Kagaku Kogyo K.K.; epoxy equivalent 200–230

The composition was applied by a bar coater to a thickness after drying of about 50 μm on a Pyrex glass of 10 cm×10 cm which had been subjected to sonication washing treatment in a washing liquid Difreon (produced by Daikin Kogyo K.K.) and dried. On the surface of this composition, a polyethylene terephthalate film with a thickness of 16 μm (Lumilar T type) was laminated. Next, with a mask for resolution test being placed in close contact thereon, exposure was effected for 20 seconds with a high pressure mercury lamp so that the luminance in the vicinity of 254 nm became 34 mW/cm² on the irradiated surface. After exposure, the polyethylene terephthalate film was peeled off, and development was carried out according to the spray system by use of 1,1,1-trichloroethane at 35° C. for 60 seconds. The resolution of the resin composition after development was found to accurately reproduce the line/interval pattern with a width of 250 μm.

Then, the substrate was dried by heating at 80° C. for 10 minutes, subjected to post-exposure of 10 J/cm² and further to heating at 150° C. for 30 minutes to cure fully the resin composition. When the crosscut tape peel-off test was practiced for the substrate with the use of an industrial cellophane tape, 100/100 adhesiveness was exhibited, indicating complete adhesion except for the clear scars of the crosscuts.

The substrate was also dipped in an aqueous NaOH solution of pH=12 at 80° C. for 24 hours, followed by washing with water and drying, and again the crosscut tape peel-off test was practiced. As the result, no lowering in adhesive force such as peel-off, rising, etc., was observed at all.

EXAMPLE 8

By use of the GP-4, an active energy ray curing type resin composition was prepared as follows.

| | |
|---|---|
| GP-4 | 40 parts by weight |
| Epicrone 828 | 80 parts by weight |
| Epicrone N-730*[7] | 80 parts by weight |
| Triphenylsulfonium tetrafluoroborate | 12 parts by weight |
| P-toluenesulfonic acid | 4 parts by weight |
| Crystal Violet | 0.5 parts by weight |
| Hydroquinone | 0.1 parts by weight |
| Methyl cellosolve | 300 parts by weight |
| Ethanol | 50 parts by weight |

*[7]:phenol-novolac type epoxy resin produced by Dainippon Ink Kagaku Kogyo K.K.; epoxy equivalent, 170–190

The composition was applied by a bar coater to a thickness of 50 μm after drying on a 16 μm polyethylene terephthalate film (Lumilar T type). An epoxy-copper laminated plate with a thickness of 35 μm of copper foil subjected to defatting and hydrochloric acid washing treatment was preheated to 80° C., and the above film was laminated by a hot roll type laminator (HRL-24, produced by Du Pont Co.) at a roll temperature of 80° C., a roll pressure of 1 kg/cm² and a laminate speed of 1 m/min. On the laminate obtained was effected exposure through a negative mask of a circuit pattern by means of the same exposing device as Example 3 for 50 seconds. After exposure, development according to the spray system was carried out with a mixture of 1,1,1-trichloroethane/butyl cellosolve (=70/30) at 35° C. for 60 seconds. The resin composition after development was found to reproduce accurately the pattern of line/interval with a width of 200 μm.

Next, the substrate was dried by heating at 80° C. for 10 minutes, subjected to post-exposure of 10 J/cm² and further to heating at about 50° C. for 60 minutes to cure fully the resin component. Then, by use of ferric chloride of 45° Bohme, etching was practiced at 30° C. under a spray pressure of 1 kg/cm² for 90 seconds to remove copper whereby a circuit of copper was obtained. The resist could be used as such for the protective film of the circuit.

EXAMPLE 9

By use of the thermoplastic graft copolymerized polymer GP-1 prepared in Example 1, an active ray energy curing type resin composition was prepared as follows.

| | |
|---|---|
| GP-1 | 100 parts by weight |
| Epikote 828 | 60 parts by weight |
| Epikote 1001 | 50 parts by weight |
| Celloxide 2021 | 40 parts by weight |
| Triphenylsulfonium hexafluoroantimone | 10 parts by weight |
| P-toluenesulfonic acid | 4 parts by weight |
| Crystal Violet | 0.5 parts by weight |
| Hydroquinone | 0.1 parts by weight |
| Methyl cellosolve | 350 parts by weight |

When a pattern was formed and resolution, adhesiveness, chemical resistance and alkali resistance were examined according to the same methods as in Example 1 by use of this composition, entirely the same performances were found to be exhibited.

EXAMPLE 10

By use of the thermoplastic graft copolymerized polymer GP-2 prepared in Example 2, an active ray energy curing type resin composition was prepared as follows.

| | |
|---|---|
| GP-2 | 100 parts by weight |
| Epikote 1001 | 100 parts by weight |
| Diphenyliodonium tetrafluoroborate | 10 parts by weight |
| P-toluenesulfonic acid | 4 parts by weight |
| Crystal Violet | 0.5 parts by weight |
| Hydroquine | 0.1 parts by weight |
| Methyl cellosolve | 350 parts by weight |

When a pattern was formed and resolution, adhesiveness, chemical resistance and alkali resistance were examined according to the same methods as in Example 2 by use of this composition, entirely the same performances were found to be exhibited.

EXAMPLE 11

By use of the graft copolymerized polymer GP-3 prepared in Example 3, which has photopolymerizable acrylic ester groups at the graft chains, an active ray energy curing type resin composition was prepared as follows.

| | |
|---|---|
| GP-3 | 100 parts by weight |
| Epicrone 840 | 50 parts by weight |
| Celloxide 2021 | 50 parts by weight |
| Triphenylsulfonium tetrafluoroborate | 10 parts by weight |
| Crystal Violet | 0.5 parts by weight |
| Hydroquinone | 0.1 parts by weight |
| Toluene | 100 parts by weight |
| Methyl cellosolve | 200 parts by weight |

When a pattern was formed and resolution, adhesiveness, chemical resistance and alkali resistance were examined according to the same methods as in Example 3 by use of this composition, entirely the same performances were found to be exhibited.

As is apparent from the above Examples and Comparative examples, it can be understood that the active energy ray curing type resin composition of the present invention can form a pattern of high resolution and at the same time has high adhesion to a substrate, having also excellent mechanical strength as well as chemical resistance.

What is claimed is:

1. An active energy ray-curing resin composition comprising:

(i) a graft copolymerized polymer comprising a trunk chain composed mainly of structural units derived from at least one monomer selected from the group consisting of $C_{1-4}$ alkyl methacrylates, acrylonitrile and styrene, having graft chains composed mainly of structural units derived from at least one monomer selected from the group consisting of (A) hydroxyl containing acrylic monomers, (B) amino or alkylamino containing acrylic monomers, (C) carboxyl containing acrylic or vinyl monomers, (D) N-vinylpyrrolidone or its derivatives, (E) vinylpyridine or its derivatives and (F) acrylamide derivatives represented by the following general formula I:

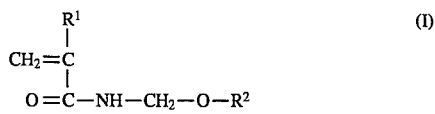

wherein $R^1$ is hydrogen or an alkyl or hydroxyalkyl group having 1 to 3 carbon atoms, and $R^2$ is hydrogen or an alkyl or acyl group having 1 to 4 carbon atoms which may have hydroxyl group, added to said trunk chain;

(ii) an epoxy resin selected from the group consisting of a bisphenol A epoxy resin, a cresol-novolac epoxy resin, an alicyclic epoxy resin and mixtures thereof; and (iii) a polymerization initiator capable of generating a Lewis acid by irradiation of an active energy ray comprising an aromatic halonium salt compound or an aromatic onium salt compound having photosensitivity containing an element belonging to Group VIA or Group VA of the Periodic Table.

2. An active energy ray-curing resin composition according to claim 1, wherein the contents of the above graft copolymerized polymer (i) and the above resin (iii) are such that G/(G+E) is within the range from 0.2 to 0.8 when the content of the above graft copolymer (i) is defined as G parts by weight and that of the above resin (iii) as E parts by weight, and the above polymerization initiator (iv) is contained in an amount within the range from 0.2 to 15 parts by weight per 100 parts by weight of (G+E).

3. An active energy ray-curing resin composition comprising:

(i) a graft copolymerized polymer comprising a trunk chain composed mainly of structural units derived from at least one monomer selected from the group consisting of $C_{1-4}$ alkyl methacrylates, acrylonitrile and styrene, having graft chains composed mainly of structural units derived from at least one monomer selected from the group consisting of (A) hydroxyl containing acrylic monomers, (B) amino or alkylamino containing acrylic monomers, (C) carboxyl containing acrylic or vinyl monomers, (D) N-vinylpyrrolidone or its derivatives, (E) vinylpyridine or its derivatives and (F) acrylamide derivatives represented by the following general formula I:

wherein $R^1$ is hydrogen or an alkyl or hydroxyalkyl group, having 1 to 3 carbon atoms, and $R^2$ is hydrogen or an alkyl or acyl group having 1 to 4 carbon atoms which may have hydroxyl group, added to said trunk chain;

(ii) a monomer having an ethylenically unsaturated bond;

(iii) an epoxy resin selected from the group consisting of a bisphenol A epoxy resin, a cresol-novolac epoxy resin, an alicyclic epoxy resin and mixtures thereof; and (iii) a polymerization initiator capable of generating a Lewis acid by irradiation of an active energy ray comprising an aromatic halonium salt compound or an aromatic onium salt compound having photosensitivity containing an element belonging to Group VIA or Group VA of the Periodic Table.

4. An active energy ray-curing resin composition according to claim 3, wherein the contents of the above graft copolymerized polymer (i), the above monomer (ii) and the above resin (iii) are such that G(G+M+E) is within the range from 0.2 to 0.8 and E/(E+M) is within the range from 0.3 to 0.7, when the content of the above graft copolymerized polymer (i) is defined as G parts by weight, that of the above monomer (ii) as M parts by weight and that of the above resin (iii) as E parts by weight, and the above polymerization initiator (iv) is contained in amount within the range from 0.2 to 15 parts by weight per 100 parts by weight of (G+M+E).

5. An active energy ray-curing resin composition according to claim 3, further comprising 0.1 to 20 parts by weight of a radical polymerization initiator which can be activated by the action of an active energy ray formulated by 100 parts by weight of the total amount of the above graft copolymerized polymer (i), the above monomer (ii) and the above resin (iii).

* * * * *

UNITED STATES PATENT AND TRADEMARK OFFICE
CERTIFICATE OF CORRECTION

PATENT NO. : 5,543,266

DATED : August 6, 1996

INVENTORS : HIROMICHI NOGUCHI ET AL.

It is certified that error appears in the above-identified patent and that said Letters Patent is hereby corrected as shown below:

ON TITLE PAGE, item

[22] Filed: Change "Mar. 13, 1995" to --March 31, 1995--.

Signed and Sealed this

Sixth Day of May, 1997

Attest:

BRUCE LEHMAN

Attesting Officer    Commissioner of Patents and Trademarks